United States Patent
Kim et al.

(10) Patent No.: US 10,014,486 B2
(45) Date of Patent: **\*Jul. 3, 2018**

(54) ORGANIC LIGHT EMITTING DIODE AND ORGANIC LIGHT EMITTING DISPLAY DEVICE INCLUDING THE SAME

(71) Applicant: SAMSUNG DISPLAY CO., LTD., Yongin, Gyeonggi-Do (KR)

(72) Inventors: Eung Do Kim, Seoul (KR); Dong Chan Kim, Hwaseong-si (KR); Won Jong Kim, Suwon-si (KR); Dong Kyu Seo, Suwon-si (KR); Da Hea Im, Incheon (KR); Sang Hoon Yim, Suwon-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 228 days.

This patent is subject to a terminal disclaimer.

(21) Appl. No.: 14/731,453

(22) Filed: Jun. 5, 2015

(65) Prior Publication Data

US 2016/0099431 A1 Apr. 7, 2016

(30) Foreign Application Priority Data

Oct. 1, 2014 (KR) .................. 10-2014-0132650

(51) Int. Cl.
*H01L 51/50* (2006.01)
*H01L 51/52* (2006.01)
*H01L 51/00* (2006.01)

(52) U.S. Cl.
CPC ...... *H01L 51/5092* (2013.01); *H01L 51/0059* (2013.01); *H01L 51/0072* (2013.01); *H01L 51/0073* (2013.01); *H01L 51/0074* (2013.01); *H01L 51/5036* (2013.01); *H01L 51/5221* (2013.01); *H01L 51/5056* (2013.01)

(58) Field of Classification Search
None
See application file for complete search history.

(56) References Cited

U.S. PATENT DOCUMENTS

| 6,278,236 | B1 * | 8/2001 | Madathil | ............ | H01L 51/5092 |
|---|---|---|---|---|---|
| | | | | | 313/504 |
| 6,452,218 | B1 | 9/2002 | Cao | | |
| 6,707,248 | B1 * | 3/2004 | Burroughes | ........ | H01L 51/5231 |
| | | | | | 313/504 |

(Continued)

FOREIGN PATENT DOCUMENTS

| CN | 1340218 A | 3/2002 |
|---|---|---|
| CN | 102468448 A | 5/2012 |

(Continued)

*Primary Examiner* — Kevin M Bernatz
(74) *Attorney, Agent, or Firm* — Lee & Morse, P.C.

(57) ABSTRACT

An organic light emitting element is provided. An organic light emitting element according to an exemplary embodiment includes: a first electrode and a second electrode that face each other; an emission layer provided between the first electrode and the second electrode; and an electron injection layer provided between the second electrode and the emission layer, wherein the electron injection layer includes Ca, and the second electrode includes a first material including at least one of Ag, Al, and Mg and a second material including at least one of Yb, Ca, Sm, Eu, Tb, Sr, Ba, La, and Ce.

16 Claims, 8 Drawing Sheets

(56) References Cited

U.S. PATENT DOCUMENTS

| | | | | |
|---|---|---|---|---|
| 8,178,870 B2* | 5/2012 | Okumoto | H01L 51/5092 | 257/103 |
| 8,569,945 B2* | 10/2013 | Lee | H01L 51/5234 | 313/503 |
| 8,716,928 B2* | 5/2014 | Kim | H01L 51/5234 | 313/504 |
| 8,895,961 B2* | 11/2014 | Yamauchi | C09K 11/06 | 257/40 |
| 9,231,225 B2* | 1/2016 | Kim | H01L 51/5092 | |
| 2001/0051284 A1* | 12/2001 | Ueda | H01L 51/5092 | 428/690 |
| 2003/0143428 A1* | 7/2003 | Kim | H01L 51/0059 | 428/690 |
| 2005/0047458 A1* | 3/2005 | Nomura | H01S 5/18305 | 372/39 |
| 2005/0088082 A1* | 4/2005 | Morita | H01L 51/5221 | 313/504 |
| 2008/0265751 A1* | 10/2008 | Smith | H01L 51/5206 | 313/504 |
| 2010/0148158 A1* | 6/2010 | Kim | C07C 2/86 | 257/40 |
| 2011/0057229 A1 | 3/2011 | Forsythe et al. | | |
| 2011/0163339 A1* | 7/2011 | Negishi | H01L 51/5271 | 257/98 |
| 2011/0309739 A1* | 12/2011 | Song | H01L 51/5088 | 313/504 |
| 2012/0007055 A1* | 1/2012 | Kim | H01L 51/5234 | 257/40 |
| 2012/0112628 A1* | 5/2012 | Yoon | H01L 51/5234 | 313/504 |
| 2012/0223633 A1* | 9/2012 | Yoshinaga | H01L 27/3211 | 313/504 |

FOREIGN PATENT DOCUMENTS

| | | |
|---|---|---|
| CN | 102655164 A | 9/2012 |
| JP | 2002-504261 A | 2/2002 |
| JP | 2004-192918 A | 7/2004 |
| JP | 2012-508945 A | 4/2012 |
| KR | 10-2012-0049639 A | 5/2012 |
| WO | WO 98/57381 | 12/1998 |
| WO | WO 2000-048258 A1 | 8/2000 |
| WO | WO 2009-084590 A1 | 7/2009 |
| WO | WO 2009/136133 A1 | 11/2009 |

* cited by examiner

ORGANIC LIGHT EMITTING DIODE AND ORGANIC LIGHT EMITTING DISPLAY DEVICE INCLUDING THE SAME

CROSS-REFERENCE TO RELATED APPLICATION

Korean Patent Application No. 10-2014-0132650 filed on Oct. 1, 2014, in the Korean Intellectual Property Office, and entitled: "Organic Light Emitting Diode and Organic Light Emitting Display Device Including the Same," is incorporated by reference herein in its entirety.

BACKGROUND

1. Field

Embodiments relate to an organic light emitting element and an organic light emitting device including the same.

2. Description of the Related Art

Recently, monitors and television sets have become thinner and lighter, as liquid crystal displays (LCD) have replaced cathode ray tube (CRT) displays. However, an LCD requires an additional backlight because the LCD is a passive light emitting device. Also, the LCD has the problems in terms of response speed and viewing angle.

As a display device capable of overcoming the aforementioned limitations, an organic light emitting device, which is a self-emitting display element having advantages of a wide viewing angle, excellent contrast, and a fast response time, has greatly attracted attention.

The organic light emitting device includes an organic light emitting element for light emission, and the organic light emitting element forms excitons from combination of electrons injected from one electrode and holes injected from another electrode in an emission layer, and the excitons emit energy such that light is emitted.

SUMMARY

Embodiments are directed to an organic light emitting element including a first electrode and a second electrode that face each other, an emission layer between the first electrode and the second electrode, and an electron injection layer between the second electrode and the emission layer. The electron injection layer includes Ca. The second electrode includes a first material including at least one of Ag, Al, and Mg and a second material including at least one of Yb, Ca, Sm, Eu, Tb, Sr, Ba, La, and Ce.

The second electrode may be formed as one layer in which the first material and the second material are co-deposited.

The electron injection layer may include a first layer including Ca and a second layer disposed between the first layer and the second electrode. The second layer may include at least of Yb, Sm, Eu, Tb, Sr, Ba, La, and Ce.

The second electrode may be formed as one layer in which Ag and Yb are co-deposited.

The second electrode may be formed as one layer in which Ag and Ca are co-deposited.

The organic light emitting element may further include an electron transport layer between the emission layer and the electron injection layer and a hole transport layer between the emission layer and the first electrode, the hole transport layer and the electron transport layer including an organic material.

The emission layer may include a red emission layer, a green emission layer, and a blue emission layer. An auxiliary layer may be at a lower end of the blue emission layer.

The auxiliary layer may include a compound represented by Chemical Formula 1:

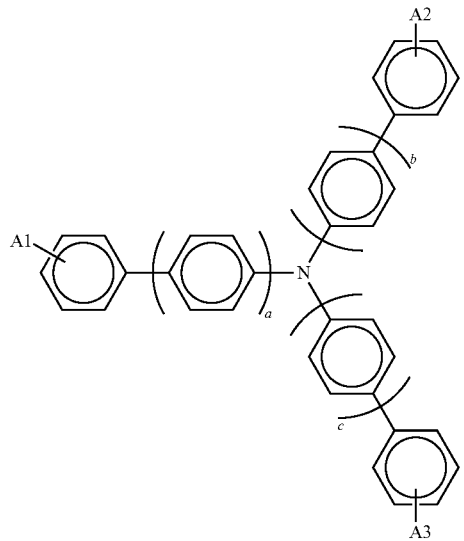

Chemical Formula 1 wherein, in Chemical Formula 1, A1, A2, and A3 are independently an alkyl group, an aryl group, carbazole, dibenzothiophene, dibenzofuran (DBF), or biphenyl, and a, b, and c are independently positive numbers of zero to four.

The auxiliary layer may include a compound represented by Chemical Formula 2:

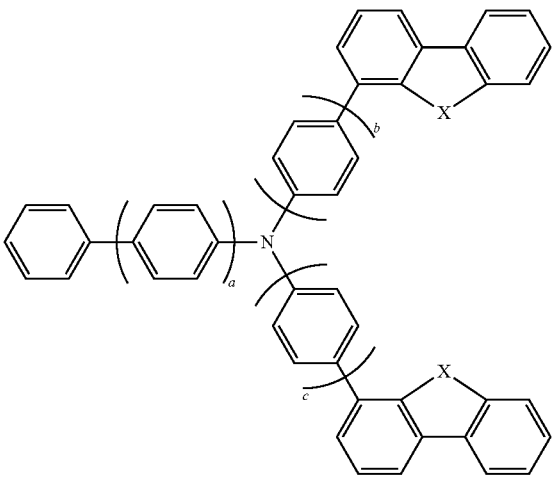

Chemical Formula 2 wherein, in Chemical Formula 2, a, b, and c are independently 0 to 3, X is selected from O, N, or S, and each X is the same or different.

Embodiments are also directed to an organic light emitting device including a substrate, a gate line on the substrate, a data line and a driving voltage line crossing a gate line, a switching thin film transistor connected to the gate line and the data line, a driving thin film transistor connected to the switching thin film transistor and the driving voltage line, and an organic light emitting element connected to the driving thin film transistor. The organic light emitting element includes a first electrode and a second electrode that face each other, an emission layer between the first electrode and the second electrode, and an electron injection layer between the second electrode and the emission layer. The electron injection layer includes Ca. The second electrode includes a first material including at least one of Ag, Al, and Mg and a second material including at least one of Yb, Ca, Sm, Eu, Tb, Sr, Ba, La, and Ce.

The second electrode may be formed as one layer in which the first material and the second material are co-deposited.

The electron injection layer may include a first layer including Ca and a second layer between the first layer and the second electrode. The second layer may include at least one of Yb, Sm, Eu, Tb, Sr, Ba, La, and Ce.

The second electrode may be formed as one layer in which Ag and Yb are co-deposited.

The second electrode may be formed as one layer in which Ag and Ca are co-deposited.

The organic light emitting device may further include an electron transport layer between the emission layer and the electron injection layer and a hole transport layer between the emission layer and the first electrode. The hole transport layer and the electron transport layer may include an organic material.

The emission layer may include a red emission layer, a green emission layer, and a blue emission layer. An auxiliary layer may be at a lower end of the blue emission.

The auxiliary layer may include a compound represented by Chemical Formula 1:

Chemical Formula 1

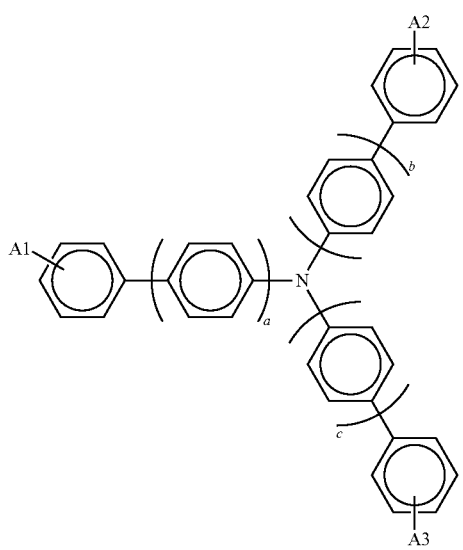

wherein, in Chemical Formula 1, A1, A2, and A3 are independently an alkyl group, an aryl group, carbazole, dibenzothiophene, dibenzofuran (DBF), or biphenyl, and a, b, and c are independently integers of zero to four.

The auxiliary layer may include a compound represented by Chemical Formula 2:

Chemical Formula 2

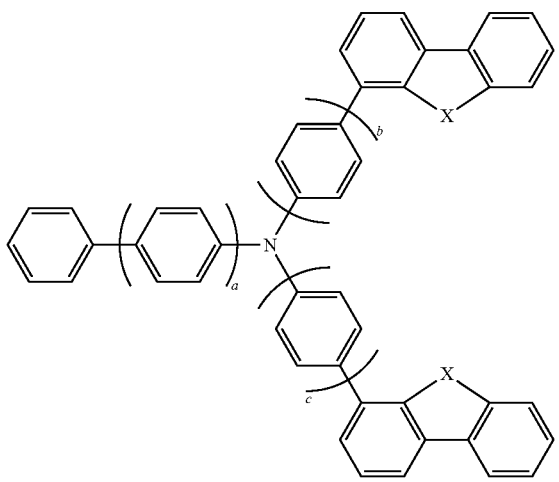

wherein, in Chemical Formula 2, a, b, and c are independently an integer of 0 to 3, X is selected from O, N, or S, and each X is the same or different.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
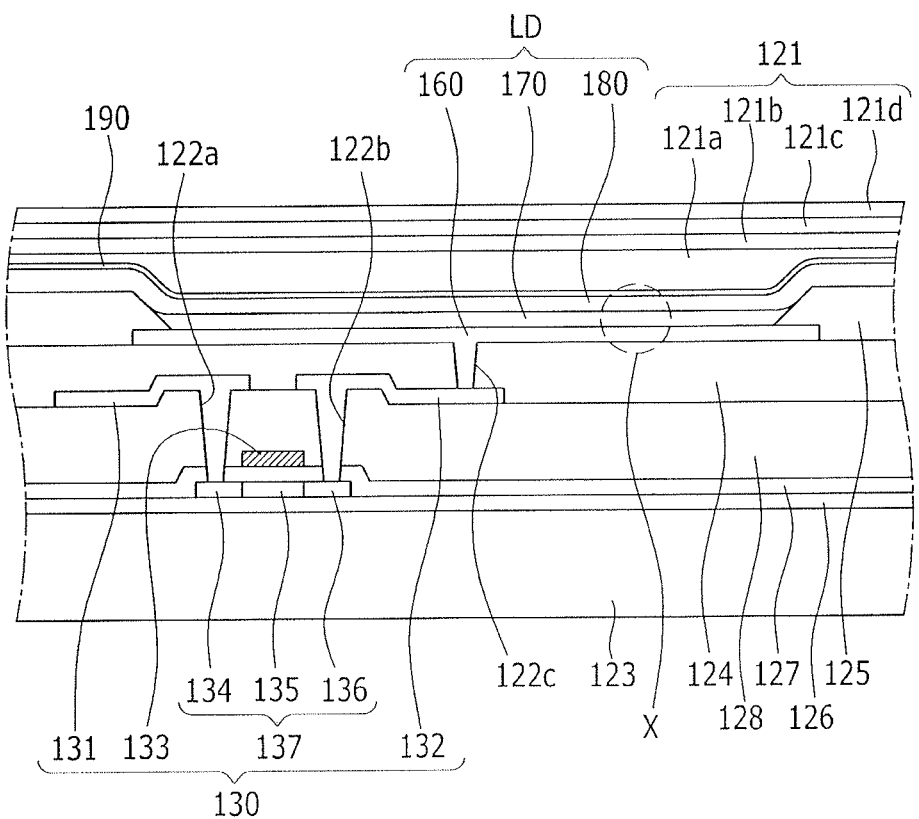
FIG. 1 illustrates a cross-sectional view of an organic light emitting device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a cross-sectional view of an organic light emitting device according to an exemplary embodiment.

Figure 2:
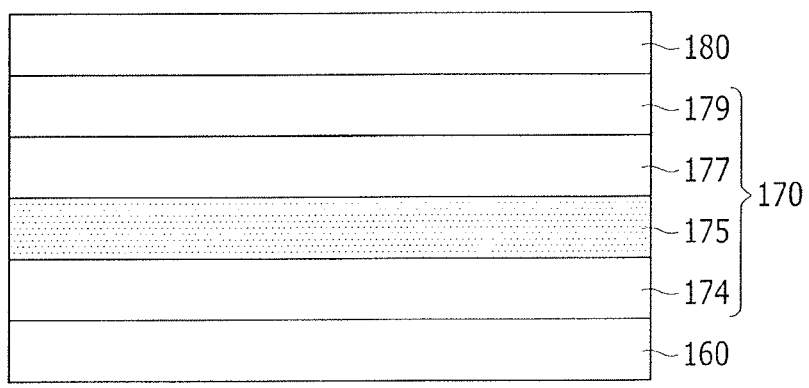
FIG. 2 illustrates an enlarged cross-sectional view of the organic light emitting display of FIG. 1.

FIG. 2 is an enlarged cross-sectional view illustrating the organic light emitting display of FIG. 1.

Referring to FIG. 1 and FIG. 2, an organic light emitting device according to an exemplary embodiment includes a substrate 123, a thin film transistor 130, a first electrode 160, a light-emitting element layer 170 and a second electrode 180. The first electrode 160 may be an anode and the second electrode 180 may be a cathode, or the first electrode 160 may be a cathode and the second electrode 180 may be an anode.

The substrate 123 may be made of an inorganic material such as glass, polycarbonate, polymethyl methacrylate, polyethylene terephthalate, polyethylene naphthalate, polyamide, and polyether sulfone, an organic material, or combinations thereof, or a silicon wafer.

A substrate buffer layer 126 may be disposed on the substrate 123. The substrate buffer layer 126 may prevent infiltration of impurities and may planarize a surface.

The substrate buffer layer 126 may be made of a suitable capable of performing the function described above. For example, the substrate buffer layer 126 may be any one of a silicon nitride ($SiN_x$) film, a silicon oxide ($SiO_x$) film, and a silicon oxynitride ($SiO_xN_y$) film. In some implementations, the substrate buffer layer 126 may be omitted in accordance with the type and the process conditions of the substrate 123.

A driving semiconductor layer 137 may be formed on the substrate buffer layer 126. The driving semiconductor layer 137 may be made of a material including polysilicon. The driving semiconductor layer 137 may include a channel region 135 not doped with impurities, and a source region 134 and a drain region 136 formed by doping ion materials at both sides of the channel region 135. The doped ion materials may be P-type impurities. For example, boron (B) or $B_2H_6$ may be used. The impurities may depend on the type of the thin film transistor.

A gate insulating layer 127 made of silicon nitride ($SiN_x$) or silicon oxide ($SiO_x$) may be disposed on the driving semiconductor layer 137. A gate wire including a driving gate electrode 133 may be disposed on the gate insulating layer 127. The driving gate electrode 133 may overlap at least a portion of the driving semiconductor layer 137, particularly, the channel region 135.

An interlayer insulating layer 128 covering the gate electrode 133 may be formed on the gate insulating layer 127. A first contact hole 122a and a second contact hole 122b that expose the source region 134 and the drain region 136 of the driving semiconductor layer 137 may be formed in the gate insulating layer 127 and the interlayer insulating layer 128. The interlayer insulating layer 128 may be made of a silicon nitride ($SiN_x$) or a silicon oxide ($SiO_x$), similar to the gate insulating layer 127.

A data wire including a driving source electrode 131 and a driving drain electrode 132 may be disposed on the interlayer insulating layer 128. The driving source electrode 131 and the driving drain electrode 132 may be connected to the source region 134 and the drain region 136 of the driving semiconductor layer 137 through the first contact hole 122a and the second contact hole 122b formed in the interlayer insulating layer 128 and the gate insulating layer 127, respectively.

The driving thin film transistor 130 may be formed by the driving semiconductor layer 137, the driving gate electrode 133, the driving source electrode 131, and the driving drain electrode 132. The configuration of the driving thin film transistor 130 may be modified in various suitable.

A planarizing layer 124 covering the data wire may be formed on the interlayer insulating layer 128. The planarizing layer 124 may planarize a surface by removing a step to increase emission efficiency of an organic light emitting diode to be formed thereon. The planarizing layer 124 may have a third contact hole 122c exposing a portion of the drain electrode 132.

The planarizing layer 124 may be made of, for example, at least one of a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

In some implementations, any one of the planarizing layer 124 and the interlayer insulating layer 128 may be omitted.

The first electrode 160 of the organic light emitting diode, for example, a pixel electrode, may be disposed on the planarizing layer 124. The organic light emitting display device may include a plurality of pixel electrodes 160 disposed in a plurality of pixels, respectively. The plurality of first electrodes 160 may be spaced from each other. The first electrode 160 may be connected to the drain electrode 132 through the third contact hole 122c of the planarizing layer 124.

A pixel defining layer 125 having an opening that exposes the first electrode 160 may be disposed on the planarizing layer 124. A plurality of openings corresponding to the pixels, respectively, may be formed in the pixel defining layer 125. A light-emitting element layer 170 may be disposed in each of the openings formed in the pixel defining layer 125. Accordingly, pixel regions where the light-emitting element layer 170 is formed may be defined by the openings formed in the pixel defining layer 125.

Each first electrode 160 may be disposed to correspond to an opening of the pixel defining layer 125. In some implementations, the first electrode 160 may be disposed to correspond not only to the opening of the pixel defining layer 125. For example, a portion of the first electrode 160 may be disposed under the pixel defining layer 125 to be overlapped by the pixel defining layer 125.

The pixel defining layer 125 may be made of a polyacryl-based resin, a polyimide-based resin, or a silicon-based inorganic material.

The light-emitting element layer 170 is disposed on the first electrode 160. The structure of the light-emitting element layer 170 will be described in detail below.

The second electrode 180, which may be a common electrode, may be disposed on the light-emitting element layer 170. Accordingly, an organic light emitting diode LD including the first electrode 160, the light-emitting element layer 170, and the second electrode 180 may be formed.

The first electrode 160 and the second electrode 180 may be made of a transparent conductive material or a semitransparent or reflective conductive material. The organic light emitting display device may be a top emission type, a bottom emission type, or a double-sided emission type, depending on the material of the first electrode 160 and the second electrode 180.

The second electrode 180 (which may be, for example, a common electrode) included in the organic light emitting element according to an exemplary embodiment may include a first material including at least one of Ag, Al, and Mg, and a second material including at least one of Yb, Ca, Sm, Eu, Tb, Sr, Ba, La, and Ce. For example, the second electrode 180 may be formed as one layer in which the first material and the second material are co-deposited.

An overcoat 190 covering and protecting the second electrode 180 may be formed of an organic layer on the second electrode 180.

A thin film sealing layer 121 may be formed on the overcoat 190. The thin film sealing layer 121 may seal and protect the organic light emitting diode LD and a driving circuit formed on the substrate 123 from the outside.

The thin film sealing layer 121 may include organic sealing layers 121a and 121c and inorganic sealing layers 121b and 121d that are alternately stacked. For example, the thin film sealing layer 121 may be formed by alternately stacking two organic sealing layers 121a and 121c and two inorganic sealing layers 121b and 121d one by one in FIG. 1.

Hereinafter, the organic light emitting element according to an exemplary embodiment will be described with reference to FIG. 2.

Referring to FIG. 2, the organic light emitting diode (including the part X in FIG. 1) according to an exemplary embodiment may have a structure in which the first electrode 160, a hole transport layer 174, an emission layer 175, an electron transport layer 177, an electron injection layer 179, and the second electrode 180 are sequentially stacked.

When the first electrode 160 is an anode, a material selected from materials having a high work function may be selected for easy hole injection. The first electrode 160 may be a transparent electrode or an opaque electrode. When the first electrode 160 is a transparent electrode, the first electrode 160 may be made of indium-tin oxide (ITO), indium-zinc oxide (IZO), tin oxide ($SnO_2$), zinc oxide (ZnO), or a conductive oxide of, for example, combinations thereof, or a metal such as aluminum, silver and magnesium, with a small thickness. When the first electrode 160 is an opaque electrode, the first electrode 160 may be made of a metal such as aluminum, silver, or magnesium.

The first electrode 160 may be formed as a two or more-layered structure including different kinds of materials. For example, the first electrode 160 may be formed to have a structure in which indium-tin oxide (ITO)/silver (Ag)/indium-tin oxide (ITO) are sequentially stacked.

The first electrode 160 may be formed by sputtering or vacuum deposition.

The hole transport layer 174 may be disposed on the first electrode 160. The hole transport layer 174 may serve to smoothly transport holes transmitted from a hole injection layer 172. The hole transport layer 174 may include an organic material. For example, the hole transport layer 174 may include NPD (N,N-dinaphthyl-N,N'-diphenyl benzidine), TPD (N,N'-bis-(3-methylphenyl)-N,N'-bis-(phenyl)-benzidine), s-TAD, MTDATA (4,4',4"-tris(N-3-methylphenyl-N-phenyl-amino)-triphenylamine), or the like.

The thickness of the hole transport layer 174 may be about 15 nm to about 25 nm. For example, the thickness of the hole transport layer 174 may be about 20 nm. A hole injection material may be included in the hole transport layer 174 as a modification of the hole transport layer 174, and thus, the hole transport/injection layers may be formed as a single layer.

The emission layer 175 may be disposed on the hole transport layer 174. The emission layer 175 may include an emission material that represents a specific color. For example, the emission layer 175 may display a basic color such as blue, green, or red, or a combination thereof.

The thickness of the emission layer 175 may be about 10 nm to about 50 nm. The emission layer 175 nay include a host and a dopant. The emission layer 175 may include a material that emits red light, green light, blue light, or white light, and may be formed using a phosphorescent or fluorescent material.

When the emission layer 175 emits the red light, the emission layer 175 may include a host material that includes CBP (carbazole biphenyl) or mCP (1,3-bis(carbazol-9-yl), and may include a phosphorescent material including at least one selected from a group of PIQIr(acac) (bis(1-phenylisoquinoline)acetylacetonate iridium), PQIr(acac) (bis(1-phenylquinoline)acetylacetonate iridium), PQIr (tris(1-phenylquinoline)iridium), and PtOEP (platinum octaethylporphyrin), or a fluorescent material including $PBD:Eu(DBM)_3(Phen)$ or perylene.

When the emission layer 175 emits the green light, the emission layer 175 may include a host material including CBP or mCP, and may include a phosphorescent material including a dopant material including $Ir(ppy)_3$ (fac-tris(2-phenylpyridine)iridium) or a fluorescent material including Alq3(tris(8-hydroxyquinolino)aluminum).

When the emission layer 175 emits the blue light, the emission layer 175 may include a host material including CBP or mCP, and may include a phosphorescent material including a dopant that includes $(4,6-F2ppy)_2Irpic$. In some implementations, the emission layer 175 may be made of a fluorescent material including at least one selected from a group of spiro-DPVBi, spiro-6P, distyrylbenzene (DSB), distyrylarylene (DSA), a PFO-based polymer, and a PPV-based polymer.

The electron transport layer 177 may be disposed on the emission layer 175. The electron transport layer 177 may transfer electrons from the second electrode 180 to the emission layer 175. In addition, the electron transport layer 177 may prevent holes injected from the first electrode 160 from moving to the second electrode 180 through the emission layer 175. The electron transport layer 177 may assist in the combining of holes and electrons in the emission layer 175 by functioning as a hole blocking layer.

The electron transport layer 177 may include an organic material. For example, the electron transport layer 177 may include any one or more selected from a group consisting of Alq3 (tris(8-hydroxyquinolino)-aluminum), PBD, TAZ, spiro-PBD, BAlq, and SAlq.

The electron injection layer 179 may be disposed on the electron transport layer 177. The electron injection layer 179 may serve to smooth electron injection to the electron transport layer 177 from the second electrode 180. In the present exemplary embodiment, the electron injection layer 179 may include Ca.

In the present exemplary embodiment, the thickness of the electron injection layer 179 may have a minimum value of about 5 angstroms (Å) by considering a process margin and may have a maximum value of about 50 angstroms (Å) by considering a difficulty as a function of the electron injection layer. Thereby, a range thereof may be about 5 angstroms (Å) to about 50 angstroms (Å). For example, the thickness of the electron injection layer may be about 10 angstroms (Å) to about 20 angstroms (Å).

The second electrode 180 may be disposed on the electron injection layer 179. The second electrode 180, which may be a common electrode of organic light emitting device, may include a first material including at least one of Ag, Al, and Mg and a second material including at least one of Yb, Ca, Sm, Eu, Tb, Sr, Ba, La, and Ce, for example, the second electrode 180 may be formed by co-depositing the first material and the second material into one layer. In some implementations, the second electrode 180 may be formed by the co-deposition of Ag and Yb, or Ag and Ca. The thickness of the second electrode may be about 90 angstroms (Å).

When forming the described second electrode 180 through the co-deposition of the first material and the second material, a volume ratio of the first material to the second material may be about 20:1.

The second electrode 180 may be formed as two or more layers.

Figure 3:
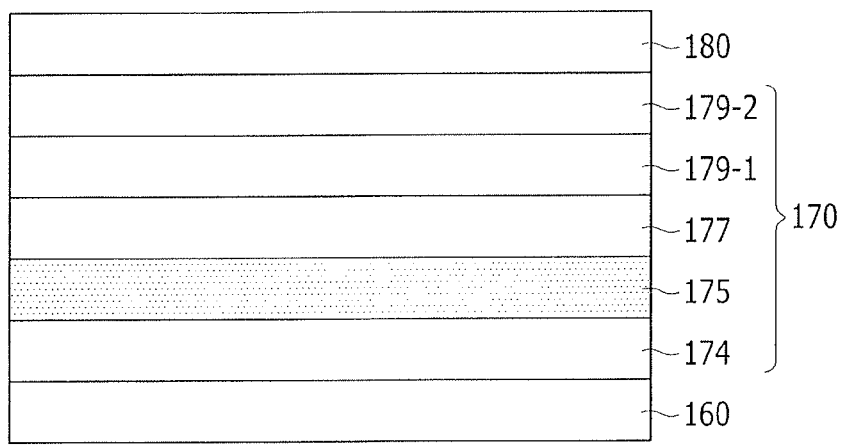
FIG. 3 illustrates a cross-sectional view of a partially modified exemplary embodiment of the organic light emitting element of FIG. 2.

FIG. 3 illustrates a cross-sectional view of a partially modified embodiment based on the organic light emitting element of FIG. 2.

Referring to FIG. 3, in the organic light emitting element, the electron injection layer 179 may be formed as two layers. In the exemplary embodiment illustrated in FIG. 3, the electron injection layer 179 may include a first electron injection layer 179-1 and a second electron injection layer 179-2. The first electron injection layer 179-1 may include a material having a low work function, such as Ca, and a second electron injection layer 179-2 may include at least one of Yb, Sm, Eu, Tb, Sr, Ba, La, and Ce. In the present exemplary embodiment, the first electron injection layer 179-1 and the second electron injection layer 179-2 may be continuously deposited.

The materials described in FIG. 2 may be applied to the exemplary embodiment of FIG. 3 as well.

Figure 4:
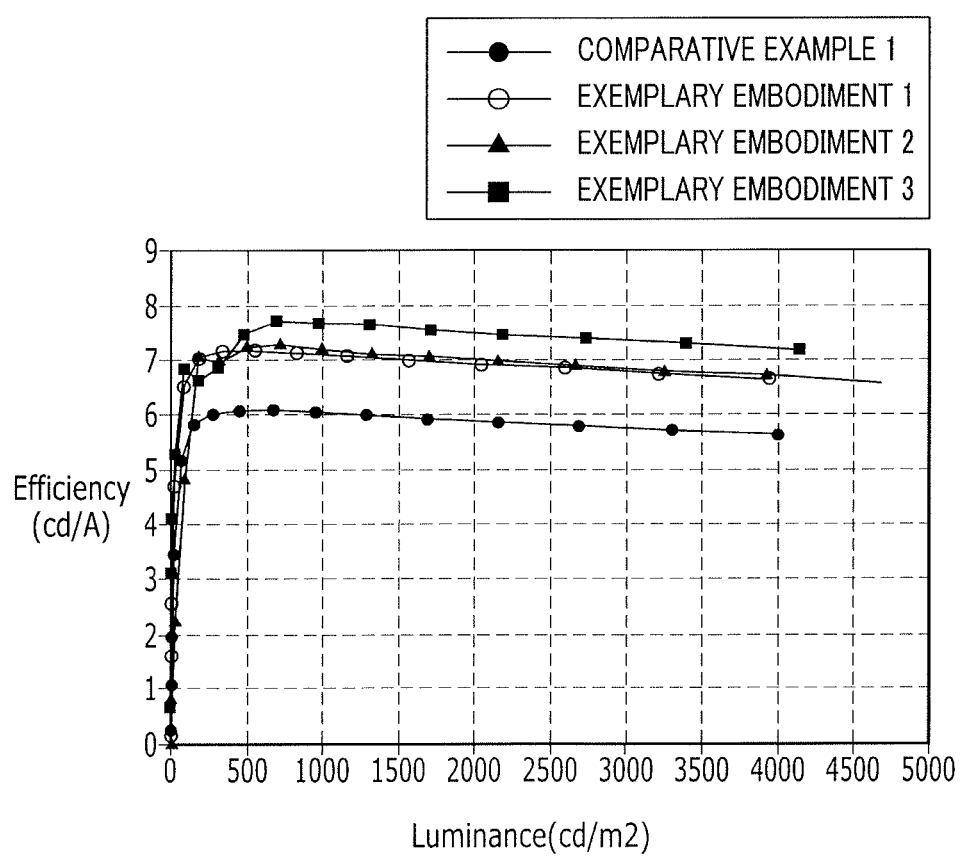
FIG. 4 illustrates a graph showing an efficiency-luminance characteristic of an organic light emitting device according to an exemplary embodiment.

FIG. 4 illustrates a graph showing efficiency-luminance characteristics of organic light emitting devices according to a Comparative Example and Exemplary Embodiments. The Comparative Example and Exemplary Embodiments are provided in order to highlight characteristics of one or more embodiments, but it will be understood that the Exemplary Embodiments are not to be construed as limiting the scope of the embodiments, nor is the Comparative Example to be construed as being outside the scope of the embodiments. Further, it will be understood that the embodiments are not limited to the particular details described in the Exemplary Embodiments and Comparative Example.

In FIG. 4, Comparative Example 1 is a case where an electron injection layer includes Yb with a thickness of 15 angstroms (Å) and a second electrode including Ag with the thickness of 90 angstroms (Å). Exemplary Embodiment 1 is a case where the electron injection layer includes Ca with a thickness of 15 angstroms (Å) and a second electrode co-deposited with Ag and Yb. Exemplary Embodiment 2 is a case where the electron injection layer includes a first layer including Ca with a thickness of 10 angstroms (Å) and a second layer deposited on the first layer and including Yb with a thickness of 10 angstroms (Å), and the second electrode co-deposited with Ag and Yb. Exemplary Embodiment 3 is a case where the electron injection layer includes a first layer including Ca with a thickness of 10 angstroms (Å) and a second layer deposited on the first layer and including Yb with a thickness of 10 angstroms (Å), and the second electrode co-deposited with Ag and Ca. In Exemplary Embodiments 1, 2, and 3, the volume ratio of Ag and Yb is 20:1.

Referring to FIG. 4, compared with Comparative Example 1, it may be confirmed that the efficiency is improved in most of the luminance range in Exemplary Embodiment 1, Exemplary Embodiment 2, and Exemplary Embodiment 3.

Table 1 shows the driving voltage and efficiency of a blue element measured in Comparative Example 1 described in FIG. 4, Exemplary Embodiment 1, Exemplary Embodiment 2, and Exemplary Embodiment 3.

TABLE 1

| | Driving voltage (V) | B efficiency (CE/y) |
|---|---|---|
| Comparative Example 1 | 4.3 | 107.0 |
| Exemplary Embodiment 1 | 4.2 | 119.4 |
| Exemplary Embodiment 2 | 4.3 | 120.4 |
| Exemplary Embodiment 3 | 4.3 | 133.6 |

Referring to Table 1, Exemplary Embodiment 1, Exemplary Embodiment 2, and Exemplary Embodiment 3 may be seen to have the same driving characteristic as Comparative Example 1. The efficiency thereof in the blue element is improved by about 10% in Exemplary Embodiment 1 and Exemplary Embodiment 2 and by about 20% in Exemplary Embodiment 3.

FIG. 5 to FIG. 8 illustrate cross-sectional views of partially modified exemplary embodiments of the organic light emitting element of FIG. 2.

Figure 5:
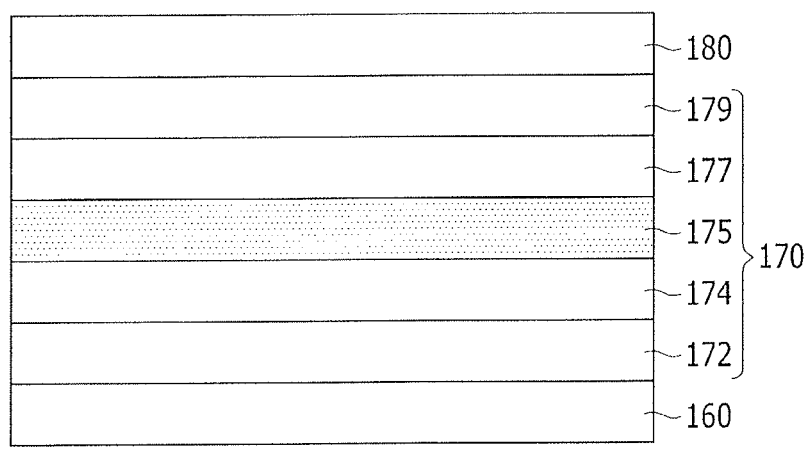
FIG. 5 to FIG. 8 illustrate cross-sectional views of a partially modified exemplary embodiment of the organic light emitting element of FIG. 2.

Referring to FIG. 5, in the organic light emitting element according to the exemplary embodiment of FIG. 2, a hole injection layer 172 may be added. The hole injection layer 172 may be disposed between the hole transport layer 174 and the first electrode 160. The hole injection layer 172 may serve to smoothly inject the hole from the first electrode 160 to the hole transport layer 174. The hole injection layer 172 may include a metal having a work function of more than 4.3 eV and a bipolar material in which a non-metal and a halogen are combined. In other implementations, the hole injection layer 172 may be formed of another inorganic material or organic material.

The metal or non-metal having a work function of 4.3 eV or more may be an element selected from a group of Ag, Au, B, Be, C, Co, Cr, Cu, Fe, Hg, Ir, Mo, Nb, Ni, Os, Pd, Pt, Re, Rh, Ru, Sb, Se, Si, Sn, Ta, Te, Ti, V, W, and Zn.

The materials described in FIG. 2 may be applied to the exemplary embodiment of FIG. 5 as well.

Figure 6:
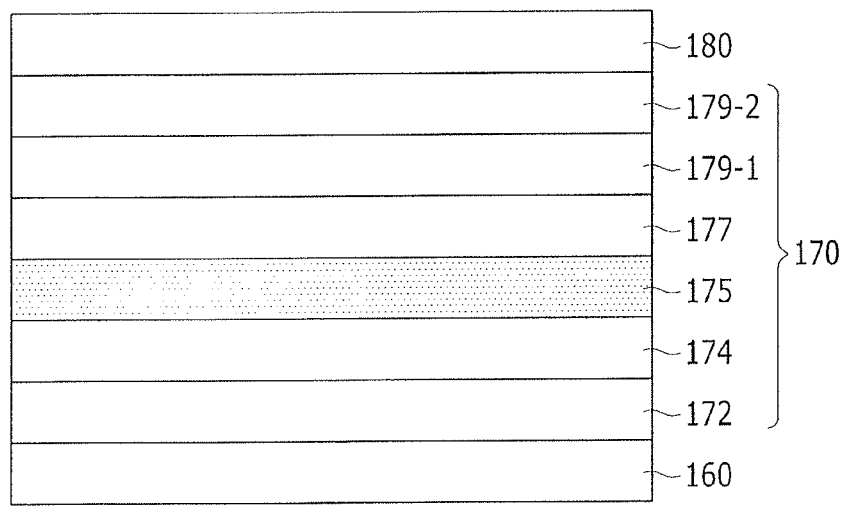

FIG. 6 illustrates a cross-sectional view of a partially modified exemplary embodiment of the organic light emitting element of FIG. 5.

Referring to FIG. 6, in the organic light emitting element according to the partially modified exemplary embodiment, the electron injection layer 179 may be formed of two layers, like the exemplary embodiment of FIG. 3.

The materials described in FIG. 3 and FIG. 5 may be applied to the exemplary embodiment of FIG. 6.

Figure 7:
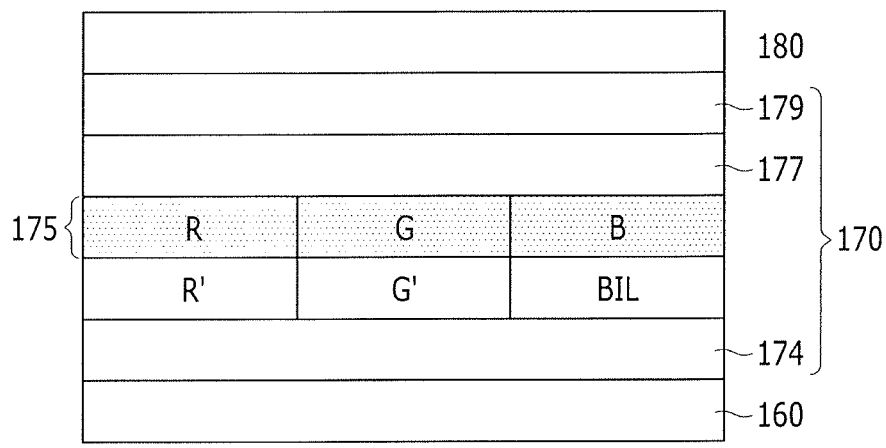

FIG. 7 illustrates a cross-sectional view of a partially modified exemplary embodiment.

Referring to FIG. 7, the emission layer 175 may be modified. In the present exemplary embodiment, the emission layer 175 may include a red emission layer R, a green emission layer G, and a blue emission layer B. An auxiliary layer BIL may be provided at a lower end of the blue emission layer B for improving the efficiency of the blue emission layer B.

The red emission layer R may be approximately 30 nm to 50 nm thick, the green emission layer G may be approximately 10 nm to 30 nm thick, and the blue emission layer B may be approximately 10 nm to 30 nm thick. The auxiliary layer BIL located at the lower end of the blue emission layer B may be less than about 20 nm thick. The auxiliary layer BIL may improve the efficiency of the blue emission layer B by controlling a hole charge balance. The auxiliary layer BIL may include a compound represented by Chemical Formula 1:

Chemical Formula 1

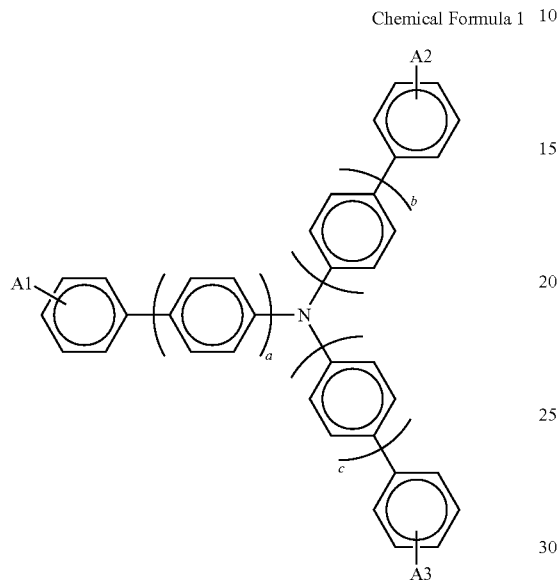

In Chemical Formula 1, A1, A2, and A3 may independently be an alkyl group, an aryl group, carbazole, dibenzothiophene, dibenzofuran (DBF), and biphenyl, and a, b, and c may independently be positive integers of zero to four.

Examples of the compounds represented by Chemical Formula 1, may include compounds represented by the following Chemical Formulas 1-1, 1-2, 1-3, 1-4, 1-5, and 1-6:

Chemical Formula 1-1

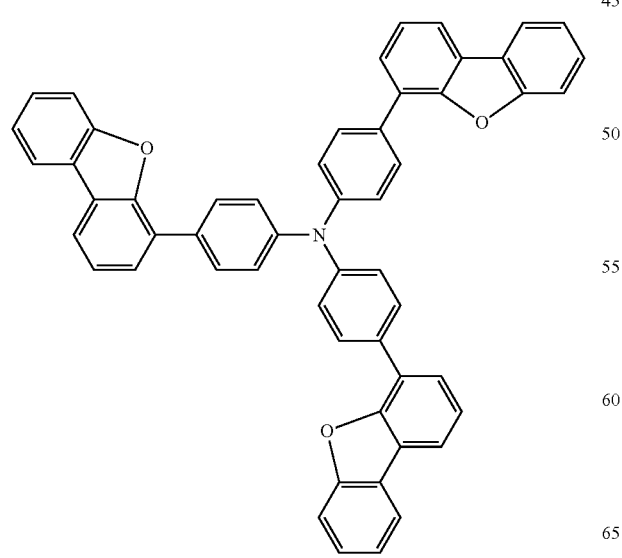

-continued

Chemical Formula 1-2

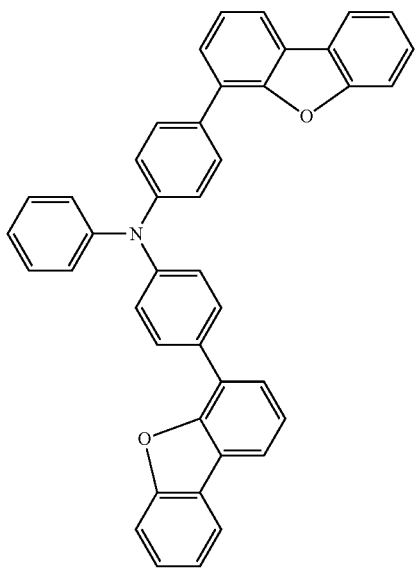

Chemical Formula 1-3

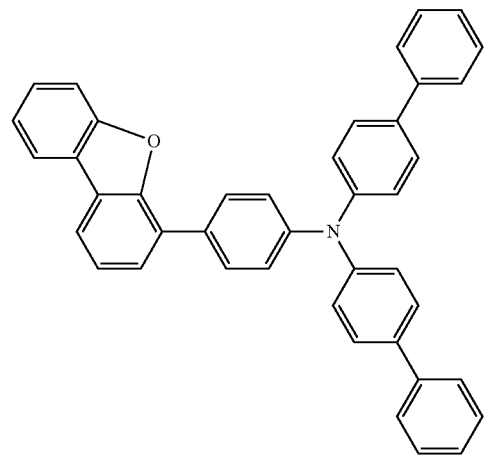

Chemical Formula 1-4

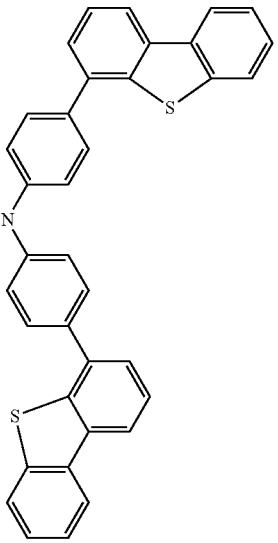

Chemical Formula 1-5

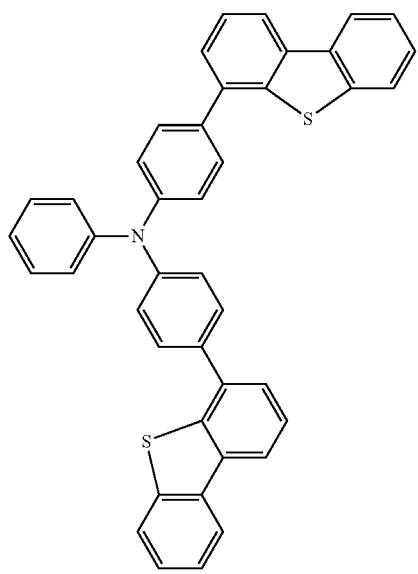

Chemical Formula 1-6

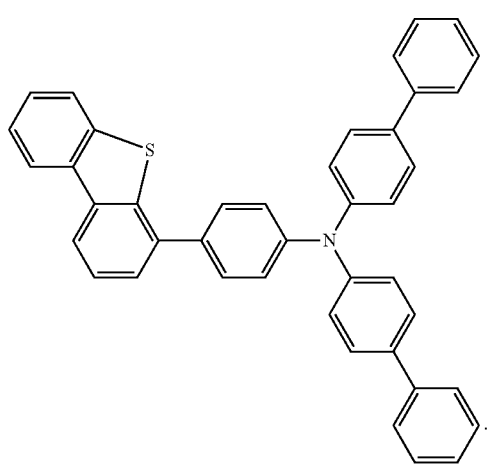

In another exemplary embodiment, the auxiliary layer BIL may include a compound represented by Chemical Formula 2.

Chemical Formula 2

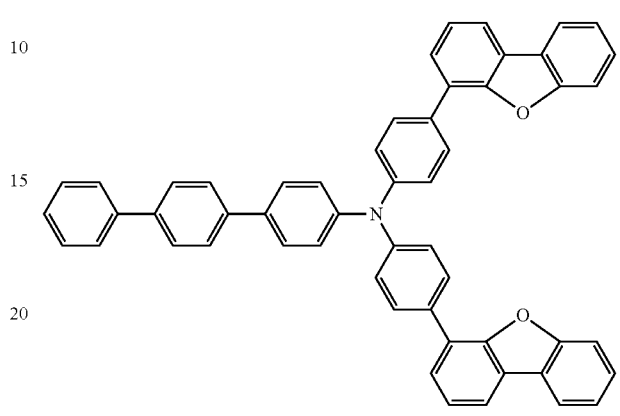

In Chemical Formula 2, a, b and c may independently be integers of 0 to 3. X may be selected from O, N, or S, and X(s) may be to the same as or different from each other.

Examples of the compound representing Chemical Formula 2 may include compounds represented by the following Chemical Formulas 2-1, 2-2, 2-3, 2-4, 2-5, and 2-6:

Chemical Formula 2-1

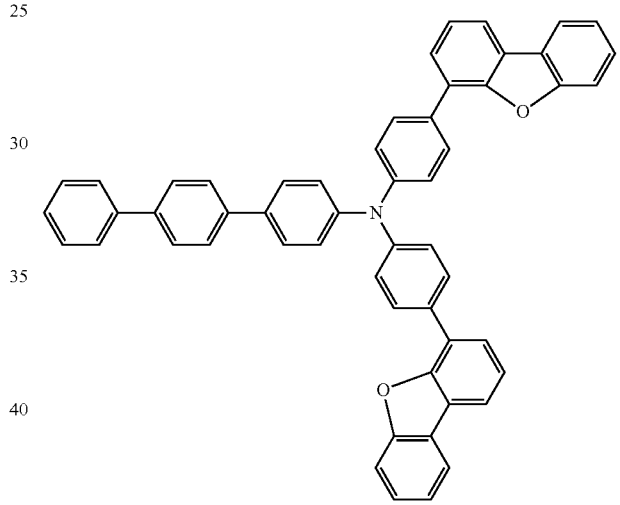

Chemical Formula 2-2

Chemical Formula 2-3

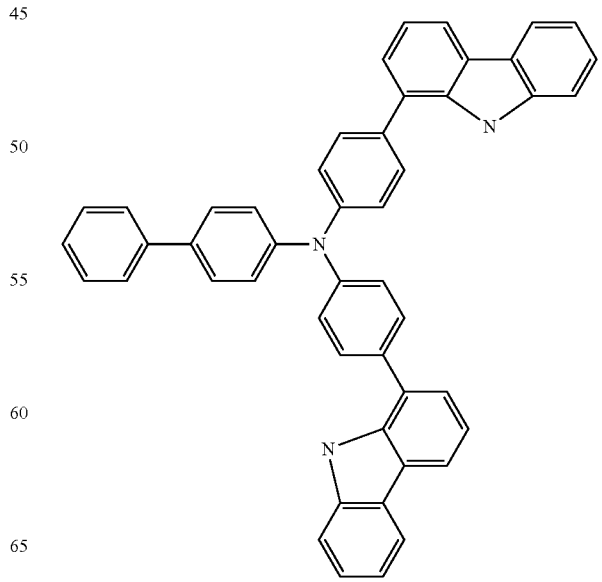

Chemical Formula 2-4

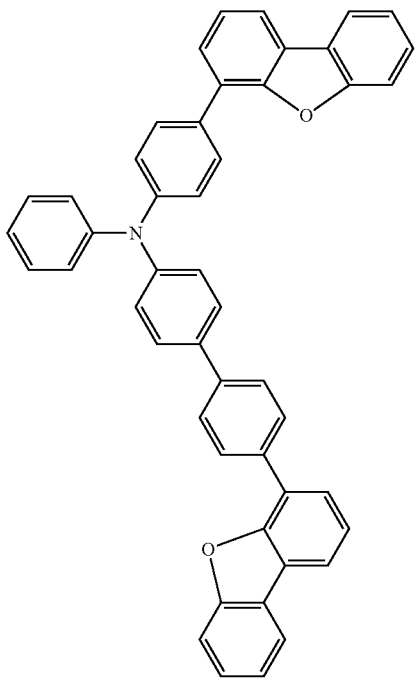

Chemical Formula 2-5

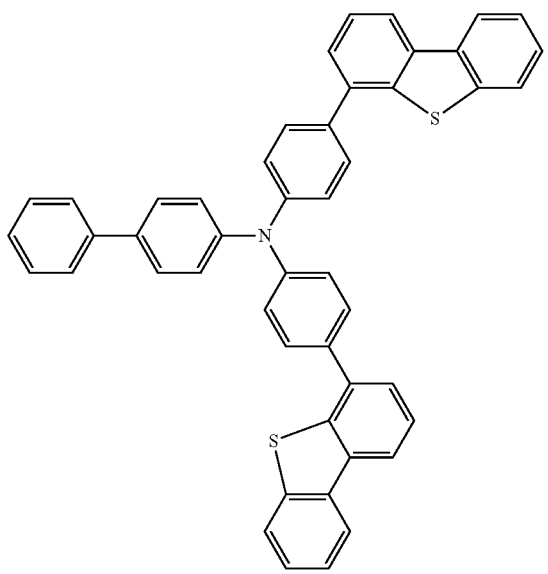

Chemical Formula 2-6

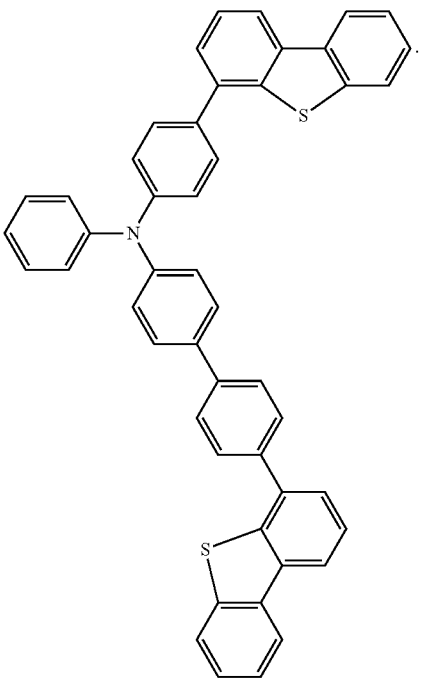

In another exemplary embodiment, the auxiliary layer BIL may include a compound represented by Chemical Formula 3.

Chemical Formula 3

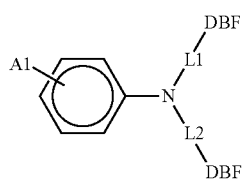

In Chemical Formula 3, A1 may be an alkyl group, an aryl group, carbazole, dibenzothiophene, or dibenzofuran (DBF), L1 and L2 may respectively be

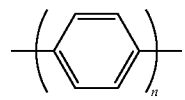

(where n is an integer of 0 to 3), and DBF connected to L1 and L2 may be replaced by carbazole or dibenzothiophene.

Hereinafter, a composition method of the auxiliary layer BIL according to an exemplary embodiment will be described. For example, the composition method of the following Chemical formula 1-1 is described.

Chemical Formula 1-1

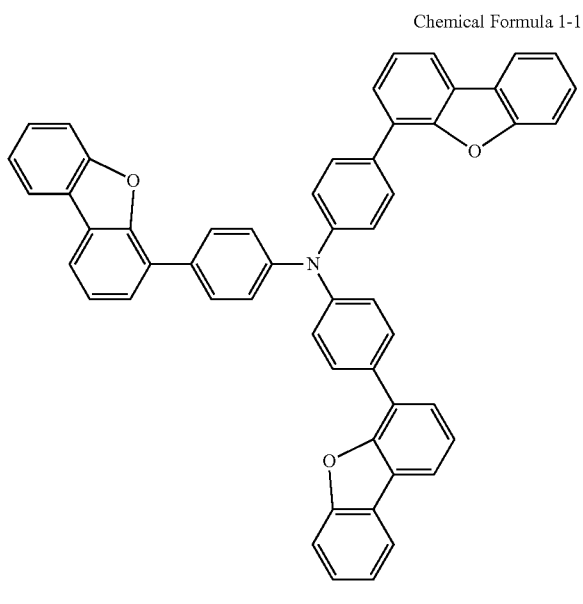 [SMILES: c1ccc2c(c1)oc1c(-c3ccc(N(c4ccc(-c5cccc6c5oc5ccccc56)cc4)c4ccc(-c5cccc6c5oc5ccccc56)cc4)cc3)cccc12]

Composition Example

Under an argon atmosphere, 4-dibenzofuran boronic acid at 6.3 g, 4,4',4"-tribromotriphenylamine at 4.8 g, tetrakis (triphenylphosphine)palladium (Pd(PPh$_3$)$_4$) at 104 mg, a sodium carbonate (Na$_2$CO$_3$) solution at 48 ml (2 M), and toluene at 48 ml were put in a 300 ml 3-neck flask, and reacted at 80° C. for eight hours. The reaction solution was extracted with toluene/water, and dried with anhydrous sodium sulfate. The resultant was condensed under low pressure, and 3.9 g of a yellowish-white powder was obtained through column purification of the obtained crude product.

Referring to FIG. 7, a red resonance auxiliary layer R' may be provided at a lower end of the red emission layer R and a green resonance auxiliary layer G' may be provided at a lower end of the green emission layer G. These resonance auxiliary layer R' and G' respectively are an additional layer for adjusting the resonance distance.

Otherwise, an additional resonance auxiliary layer may be not provided at a lower end of the blue emission layer B and the auxiliary layer BIL, which correspond to both the red emission layer R and the green emission layer G.

Although it is not illustrated in FIG. 7, the hole injection layer 172 may be formed between the first electrode 160 and the hole transport layer 174 as in the exemplary embodiment of FIG. 5.

Except for the above-described difference, the materials described with reference to FIG. 2 may be applied to the exemplary embodiment of FIG. 7.

Figure 8:
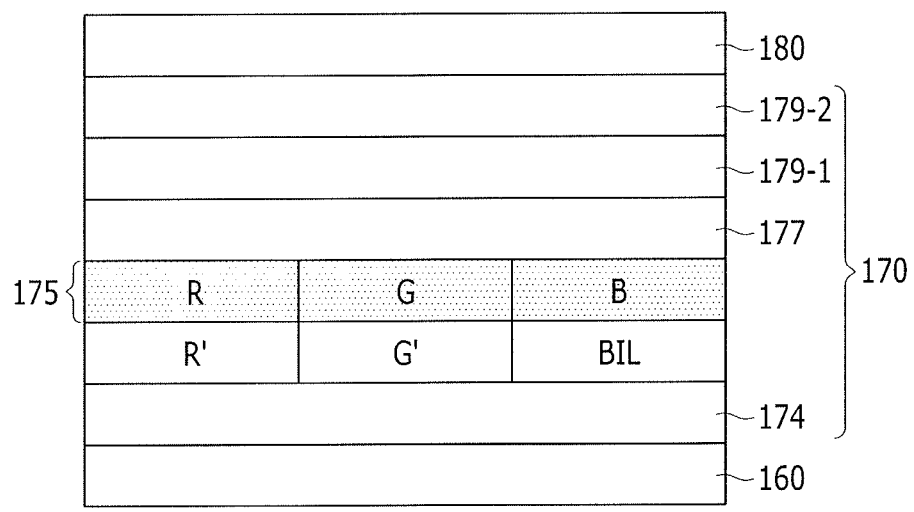

FIG. 8 is a cross-sectional view of a partially modified exemplary embodiment of the organic light emitting element of FIG. 7.

Referring to FIG. 8, in the organic light emitting element according to the partially modified exemplary embodiment of FIG. 7, the electron injection layer 179 may be formed of two layers, like the exemplary embodiment of FIG. 3.

The materials described in FIG. 3 and FIG. 7 may be applied to the exemplary embodiment of FIG. 8.

By way of summation and review, a general organic light emitting device may have a high driving voltage, high light emission brightness, low luminance and light emission efficiency, and a short life span.

Embodiments provide an organic light emitting element having high efficiency and a long life span, and a light emitting display including the same. By forming the electron injection layer to include Ca, the emission efficiency may be increased. By forming the auxiliary layer at the lower end of the blue emission layer, the emission efficiency of the blue emission layer may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light emitting element, comprising:
   a first electrode and a second electrode that face each other;
   an emission layer between the first electrode and the second electrode; and
   an electron injection layer between the second electrode and the emission layer,
   wherein the electron injection layer includes a first layer consisting of Ca and a second layer consisting of at least one of Yb, Sm, Eu, Tb, Sr, Ba, La, and Ce,
   the first layer is between the second layer and the emission layer, and
   the second electrode includes a first material including at least one of Ag, Al, and Mg and a second material including at least one of Yb, Ca, Sm, Eu, Tb, Sr, Ba, La, and Ce.

2. The organic light emitting element as claimed in claim 1, wherein:
   the second electrode is formed as one layer in which the first material and the second material are co-deposited.

3. The organic light emitting element as claimed in claim 2, wherein:
   the second electrode is formed as one layer in which Ag and Yb are co-deposited.

4. The organic light emitting element as claimed in claim 2, wherein:
   the second electrode is formed as one layer in which Ag and Ca are co-deposited.

5. The organic light emitting element as claimed in claim 1, further comprising:
   an electron transport layer between the emission layer and the electron injection layer and a hole transport layer between the emission layer and the first electrode, the hole transport layer and the electron transport layer including an organic material.

6. The organic light emitting element as claimed in claim 1, wherein:
   the emission layer includes a red emission layer, a green emission layer, and a blue emission layer, and the organic light emitting display device further includes an auxiliary layer between the blue emission layer and the first electrode.

7. The organic light emitting element as claimed in claim 6, wherein:
the auxiliary layer includes a compound represented by Chemical Formula 1:

Chemical Formula 1

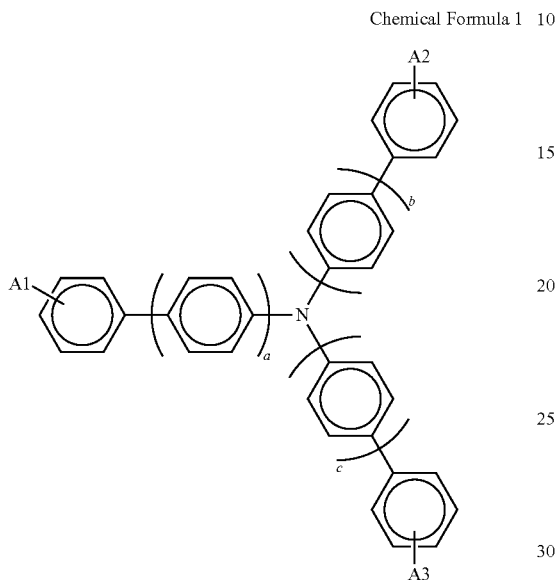

wherein, in Chemical Formula 1, A1, A2, and A3 are independently hydrogen, a phenyl group, a carbazole group, a dibenzothiophenegroup, a dibenzofuran (DBF) group, or a biphenyl group, and a, b, and c are independently integers of zero to four.

8. The organic light emitting element as claimed in claim 6, wherein
the auxiliary layer includes a compound represented by Chemical Formula 2:

Chemical Formula 2

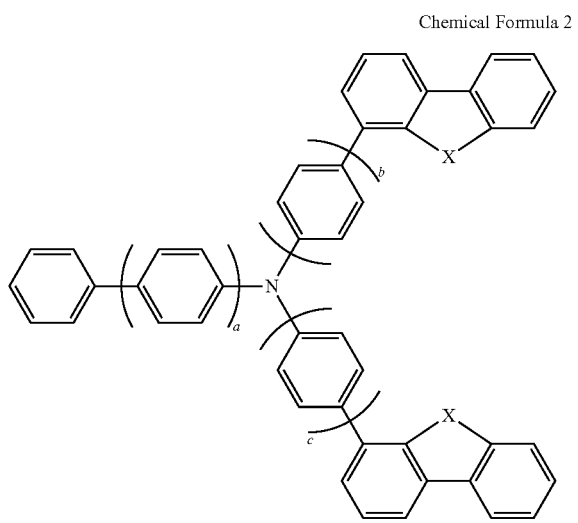

wherein, in Chemical Formula 2, a, b, and c are independently 0 to 3, X is selected from O, N, or S, and each X is the same as or different.

9. An organic light emitting device, comprising:
a substrate;
a gate line on the substrate;
a data line and a driving voltage line crossing a gate line;
a switching thin film transistor connected to the gate line and the data line;
a driving thin film transistor connected to the switching thin film transistor and the driving voltage line; and
an organic light emitting element connected to the driving thin film transistor,
wherein the organic light emitting element includes:
a first electrode and a second electrode that face each other;
an emission layer between the first electrode and the second electrode; and
an electron injection layer between the second electrode and the emission layer,
wherein:
the electron injection layer includes a first layer consisting of Ca and a second layer consisting of at least one of Yb, Sm, Eu, Tb, Sr, Ba, La, and Ce,
the first layer is between the second layer and the emission layer, and
the second electrode includes a first material including at least one of Ag, Al, and Mg and a second material including at least one of Yb, Ca, Sm, Eu, Tb, Sr, Ba, La, and Ce.

10. The organic light emitting device as claimed in claim 9, wherein the second electrode is formed as one layer in which the first material and the second material are co-deposited.

11. The organic light emitting device as claimed in claim 10, wherein
the second electrode is formed as one layer in which Ag and Yb are co-deposited.

12. The organic light emitting device as claimed in claim 10, wherein
the second electrode is formed as one layer in which Ag and Ca are co-deposited.

13. The organic light emitting device as claimed in claim 9, further comprising
an electron transport layer between the emission layer and the electron injection layer and a hole transport layer between the emission layer and the first electrode, and
the hole transport layer and the electron transport layer include an organic material.

14. The organic light emitting device as claimed in claim 9, wherein:
the emission layer includes a red emission layer, a green emission layer, and a blue emission layer, and
the organic light emitting display device further includes an auxiliary layer between the blue emission and the first electrode.

15. The organic light emitting device as claimed in claim 14, wherein the auxiliary layer includes a compound represented by Chemical Formula 1:

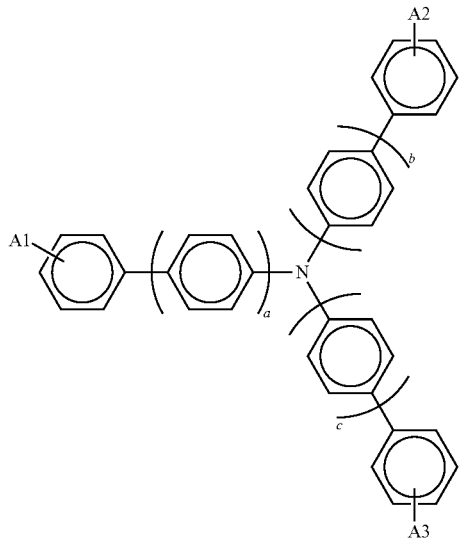

Chemical Formula 1 wherein, in Chemical Formula 1, A1, A2, and A3 are independently hydrogen, a phenyl group, a carbazole group, a dibenzothiophene group, a dibenzofuran (DBF) group, or a biphenyl group, and a, b, and c are independently integers of zero to four.

16. The organic light emitting device as claimed in claim 14, wherein the auxiliary layer includes a compound represented by Chemical Formula 2:

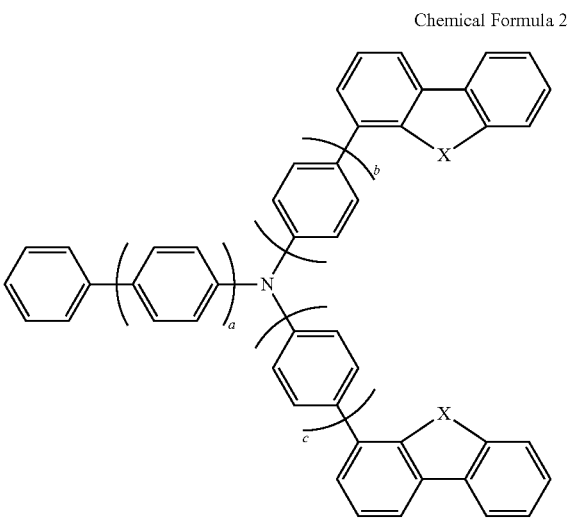

Chemical Formula 2 wherein, in Chemical Formula 2, a, b, and c are independently an integer of 0 to 3, X is selected from O, N, or S, and each X is the same or different.

* * * * *